United States Patent

Berger

Patent Number: 6,130,431
Date of Patent: Oct. 10, 2000

[54] MONOLITHIC PATTERN-SENSITIVE DETECTOR

[75] Inventor: Kurt W. Berger, Livermore, Calif.

[73] Assignee: E.U.V., L.L.C., Livermore, Calif.

[21] Appl. No.: 09/096,598

[22] Filed: Jun. 12, 1998

[51] Int. Cl.$^7$ .............................................. H01L 31/0328
[52] U.S. Cl. .......................................... 250/372; 250/365
[58] Field of Search ..................................... 250/372, 365

[56] References Cited

U.S. PATENT DOCUMENTS 5,598,014   1/1997   Barany et al. ........................... 250/372

OTHER PUBLICATIONS

Ogawa et al., "Normal incidence spectrophotometer with high-density transmission grating technology and high-efficiency silicon photodiodes for absolute solar extreme-ultraviolet irradiance measurements", Optical Engineering, vol. 32, No. 12/3121-25, Dec. 1993.

Gullikson et al., "Stable silicon photodiodes for absolute intensity measurements in the VUV and soft x-ray regions", Proc. of the VUV-11 Conference.

*Primary Examiner*—Constantine Hannaher
*Assistant Examiner*—Andrew Israel
*Attorney, Agent, or Firm*—Burns, Doane, Swecker & Mathis, L.L.P.

[57] ABSTRACT

Extreme ultraviolet light (EUV) is detected using a precisely defined reference pattern formed over a shallow junction photodiode. The reference pattern is formed in an EUV absorber preferably comprising nickel or other material having EUV- and other spectral region attenuating characteristics. An EUV-transmissive energy filter is disposed between a passivation oxide layer of the photodiode and the EUV transmissive energy filter. The device is monolithically formed to provide robustness and compactness.

24 Claims, 1 Drawing Sheet

MONOLITHIC PATTERN-SENSITIVE DETECTOR

The U.S. Government has a paid-up license in this invention and the right in limited circumstances to require the patent owner to licence others on reasonable terms as provided for by the terms of Contract No. DE-AC04-94AL85000 awarded by the Department of Energy.

BACKGROUND OF THE INVENTION

1. Field of the Invention

The invention relates to electromagnetic radiation detectors, and more particularly, to pattern-sensitive detectors operating in the extreme ultraviolet (EUV) light range.

2. Description of Related Art

The detection of radiation in the extreme ultraviolet range (EUV) is conventionally accomplished using EUV-sensitive photodiodes which have specialized structures allowing the detection of 60 eV–500 eV photons through the use of shallow (~300 Å) N-P junction diffusion. The use of silicon-based photodiodes to detect EUV radiation is complicated by the fact that such photodiodes can detect photon energies as low as the far infrared with better sensitivities than in the EUV. This is a consequence of the higher transparency of the silicon material of the N-P junction to light at wavelengths near the infrared as compared to light at wavelengths near the EUV. To overcome the limitations of the EUV-silicon interactions, shallow junction photodiodes have been developed. A shallow junction is necessary since photons in the EUV spectrum are highly attenuated in most materials and it is necessary for photons to enter the depletion region of the N-P junction in order to be adequately detected. Prior art photodiodes are discussed in the articles "Stable Silicon Photodiodes For Absolute Intensity Measurements In The VUV and Soft X-Ray Regions," by E. M. Gullikson, et al., (Journal of Electron Spectroscopy and Related Phenomena, Proc. of the VUV-11 Conference), "Photoemission From Silicon Photodiodes and Induced Changes in the Detection Efficiency in the Far Ultraviolet," by R. E. Vest, et al. (Jun. 20, 1997), and "Normal Incidence Spetrophotometer With High-Density Transmission Grating Technology and High-Efficiency Silicon Photodiodes for Absolute Measurements," by Ogawa et al.(Optical Engineering 32(12), 3121–3125, December 1993).

A recognized problem with shallow junction photodiode structures of the prior art is that optically generated carriers are intercepted from the detector's electrodes by recombination with surface impurities. This problem usually prevents the detection of the intercepted photons and results in an inconsistent current response to incident radiation. According to tests, contaminants absorbed through the light-impinged surface of the photodiode can be responsible for as much as a thirty-percent variation in the response characteristics of the device.

Use of shallow junction silicon photodiodes in aerial image measurement (AIM) and lithographic and other applications in the EUV light range requires the arrangement of a precisely defined and positioned absorber having appropriate patterning formed thereon for selective transmission of the EUV light. Current EUV lithography systems operate at a wavelength of 13.4 nm. The short absorption depth of 13.4 nm radiation in all materials dictates the use of extremely thin membranes to support the absorber. Moreover, these membranes must be suspended at a precisely controlled distance from the photodiode while being subjected to the abusive evacuation processes required for transmission of the EUV radiation (air is impermeable to EUV radiation). Rupture of the membranes is not uncommon, providing for low yield and costly assembly and operational procedures.

SUMMARY OF THE INVENTION

The invention overcomes the deficiencies of the prior art by providing a detector device for detecting extreme ultraviolet (EUV) light with reference to a precisely positioned optical reference disposed on the surface of a specialized photodiode structure. The detector device can detect pattern sizes on the order of the diffraction limit of EUV light (~10 nm) and can provide statistically relevant data with an EUV flux as small as $10^8$ photons/second.

The detector of the invention is monolithic in structure, providing the additional advantage of robustness and compatibility with the extreme physical environments in which its manufacture and use are contemplated. The monolithic construction also enables precise control of the dimensional characteristics of the detector.

The functional description of the detector in accordance with the invention can be divided into three basic components: A shallow junction EUV-sensitive photodiode, an EUV-transmissive energy filter, and an optical reference pattern absorber. These components are configured into a single monolithic element which is fabricated using a novel monolithic assembly process complementing the usefulness of the detector in the EUV by improving factors of yield, reliability, detector variation, compactness and cost. Compactness is particularly important in AIM applications because of the limited space available in the projection path in which the detector is disposed.

The detector in accordance with the invention is adapted to detect EUV photons passing first through the optical reference pattern absorber, then through EUV-transmissive energy filter, and finally into the photodiode. The EUV-impinged photodiode surface is kept clean of impurities, which would otherwise intercept optically-generated carriers and thereby detract from detector performance, by having formed thereon a high quality passivation oxide layer integral to the photodiode surface. The EUV-transmissive energy filter is then deposited on this passivation oxide layer, while the optical reference pattern is formed on the EUV-transmissive energy filter.

The photodiode used in the detector of the invention is a commercially available N-P junction diode structure providing high sensitivity, high dynamic range and good room temperature noise performance and may be of the type available from International Radiation Detectors™. The EUV-transmissive energy filter is provided in order to block photons of energies lower than the desired EUV while passing a significant quantity of the EUV photons. Candidate materials for the EUV-transmissive filter are beryllium, zirconium, niobium and yttrium.

The optical reference pattern absorber serves to define a region on the detector surface that will pass EUV photons to the photodiode. Because of the short wavelength of EUV photons, this pattern can be quite small—approaching the diffraction limit of EUV light. The pattern is precisely defined to match the application of the detector and is not limited to a particular shape. The pattern, because of its integral formation with the detector in the monolithic configuration in accordance with the invention, is immune from the physically damaging effects of evacuation required for operation in the EUV light range and from other extreme physical conditions to which the detector may be subject.

BRIEF DESCRIPTION OF THE DRAWINGS

Many advantages of the present invention will be apparent to those skilled in the art with a reading of this specification in conjunction with the attached drawing, wherein like reference numerals are applied to like elements and wherein:

The drawing figure is a schematic view of a monolithic pattern-sensitive detector in accordance with the invention.

DESCRIPTION OF THE PREFERRED EMBODIMENTS

Figure 1:
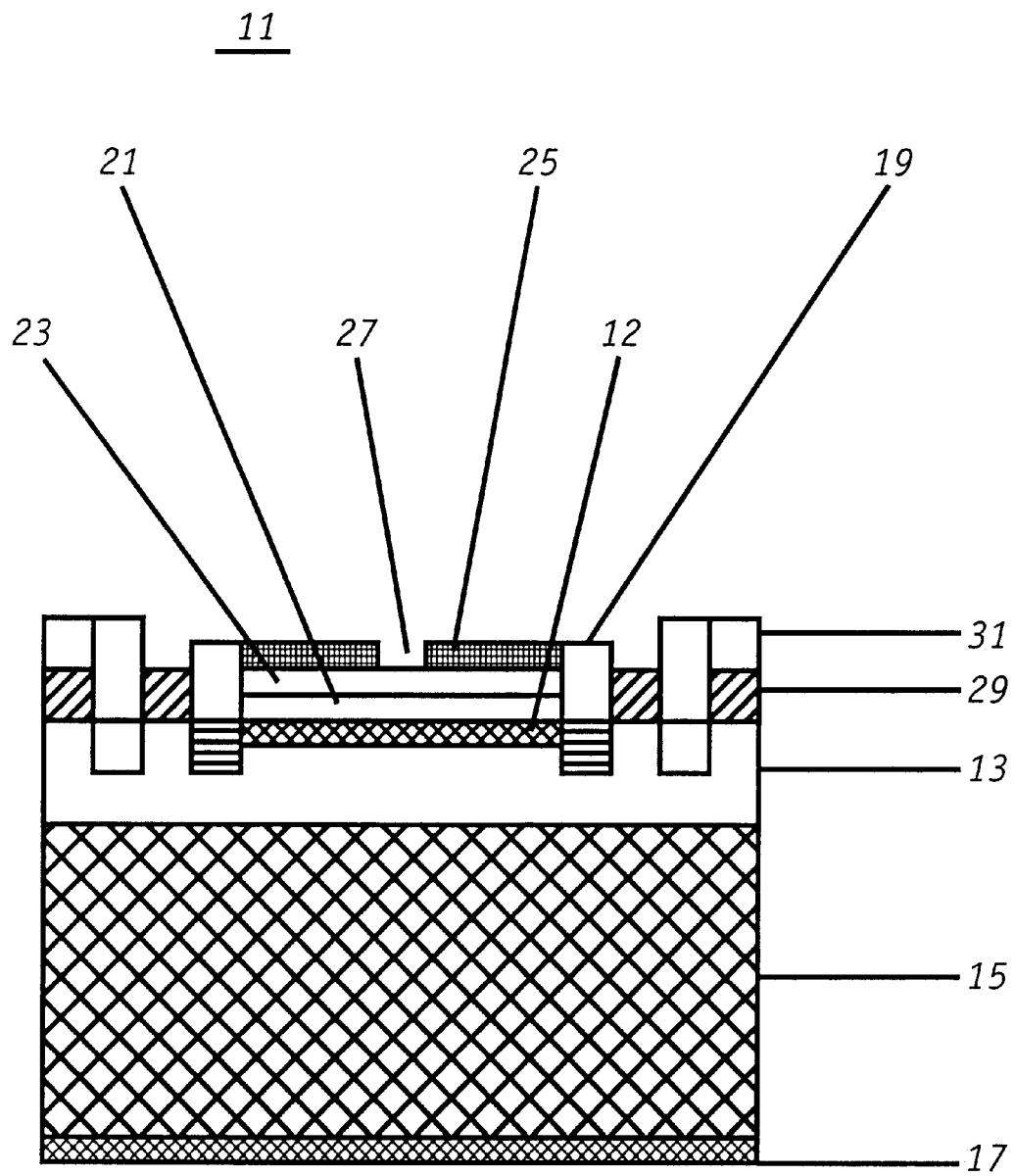

FIG. 1 shows a monolithic, pattern-sensitive detector 11 for detecting EUV (extreme ultraviolet) light in accordance with the invention. The detector is essentially comprised of three main components monolithically formed into a single structure. The first of these components is a shallow junction photodiode comprised of an N-doped region 12 and a P-EPI region 13. These regions 12, 13 form the structure of the semiconductor diode and are disposed over a P+ substrate 15 which operates as a base structure for deposition of subsequent layers in the detector fabrication process. An anode region 17 and a cathode 19 serve to electrically connect the device, which is typically reverse-biased in photoconductive mode when in normal operation. Anode region 17 and cathode 19 provide contacts for collecting 100 eV photons optically generated in the N-P-EPI region of the photodiode. An isolation oxide 29 is provided as an insulator to prevent electrical conduction from the deposited cathode 19 to the anode 17 without passage through the N-P junction of the photodiode, while a guard contact 31 guards the N-P junction from stray charge that tends to collect in biased junctions. Deposited over the N region 12 of the photodiode is a passivation oxide layer 21 which comprises a high quality passivation oxide, preferably nitrided, and which is preferably of about 60 Å thickness. Functionally, this passivation layer 21 prevents surface recombination of optically generated carriers from despoiling the intrinsic 100% quantum efficiency of the device. The composition of the passivation oxide 21 may be nitrided silicon dioxide.

The shallow junction photodiode used in the invention may be of the type commercially available from, for example, International Radiation Detectors™. Alternatively, other shallow junction devices can be used. including a P-N rather than the N-P structure described above (that is, the layer which is first impinged by the EUV in an alternative, P-N device would be a P-doped region, disposed over an N-doped substrate). Those skilled in the art would make the selection of the particular photodiode structure in accordance with the contemplated use and mindfully of the advantages and drawbacks attendant to the particular device chosen.

The second main component of detector 11 is an EUV-transmissive energy filter 23. Disposed over the passivation oxide layer 21, the EUV-transmissive energy filter 23 prevents the detector from detecting energies lower than about 10 eV, thereby rendering the detector insensitive to visible and IR radiation, while providing only about a 30% loss to photons at the 100 eV range. Materials from which the EUV-transmissive filter can be selected include beryllium, zirconium, niobium and yttrium, which can operate to block photons of energies lower than that of the desired EUV radiation while passing a significant quantity of the EUV photons. Although desirable to use a filter having a bandpass throughput of the photons in the EUV, the diode junction's own intrinsic diffusion depth can be exploited such that the material chosen for the filter 23 need only pass EUV photons more readily (with, for example, ~10% absorption) than lower energy photos (with for example ~99.9% absorption). Hence an energy filter having a photon absorption characteristic favoring transmission of EUV photons of a predetermined energy level over photons of lower energy can be used. It should be noted that the filter 23 can also be disposed remotely from the detector 11, or other means of controlling the wavelength and energy of the impinging radiation, such as use of a monochromatic source, can be utilized without inventive departure from the spirit and scope of the invention. However, as discussed below, the preferred method by which the detector 11 is fabricated requires the use of the filter 23, or an equivalent thereto, in order to shield the underlying layer—namely, the passivation layer 21—during the pattern (27) etching procedure and to thereby prevent leaching into the passivation layer 21 and resultant compromise of device performance. By implication, when other pattern making procedures are employed, filter 23 becomes dispensable.

The third main component of detector 11 in accordance with the invention comprises optical reference pattern absorber 25 formed over EUV-transmissive energy filter 23. Absorber 25 is comprised of a material which is highly attenuating in the EUV and other spectral regions. Candidate materials, which preferably attenuate incoming 100 eV EUV photons by at least $10^4$ in a very thin (~1,000 Å) film are nickel, silver, germanium and gold. Formed in absorber 25 is a reference pattern 27 depicted schematically as a gap in absorber 25, exemplarily representing a cross-sectional view of a slit. Of course, it is contemplated that the reference pattern 27 can take any desired shape, depending on the particular application of the detector 11, and may include for example a reference grating. Absorber 25 operates to very precisely define reference pattern 27 on the detector surface, thereby defining the effective aperture through which the EUV photons are transmitted to the detector 11. Because of the short wavelength of EUV photons, reference pattern 27 can be very small—that is, of a critical dimension of about 0.1 μm and approaching the ~10 nm diffraction limit of EUV light.

Fabrication of the above-described structure is as follows. Standard lithographic techniques are first used to create a shallow diffusion photodiode comprising an N region 12 diffused into P substrate 15. Oxide layer 21 is then deposited by for example depositing silicon dioxide, with a nitrogen anneal environment to reduce contamination, in a sputtering or CVD process. The isolation oxide layer 29 is then formed, along with cathode contact 19.

The next step in the fabrication of the detector 11 comprises masking and depositing EUV-transmissive energy filter 23 over passivation oxide layer 21. This is effected by for example sputtering from a magnetron system, or by hot filament deposition. A thin layer (on the order of 60 Å) of titanium may be interspersed between the material of the EUV-transmissive filter 23, which preferably is zirconium, and the passivation oxide 21 to enhance adhesion of the filter material to the oxide 21. It should be noted that the technique used for depositing EUV-transmissive energy filter 23 is a low-temperature technique such that the entire substrate of the diode does not exceed 200° C. in order to avoid adverse effects of high temperature on the photodiode performance.

As a final step, the absorber layer 25 is deposited atop the EUV-transmissive energy filter 23 by for example nickel sputtering. The absorber 25 is patterned by a direct ray electron beam process or a dry etch process using a reactive ion etcher to etch out the nickel material of the absorber 25 and thereby form pattern 27 therein. EUV-transmissive energy filter 23 plays an important role in this part of the fabrication procedure by preventing the etching process of the pattern 27 from leaching down to the passivation oxide 21 and compromising the conductivity of the photodiode. EUV-transmissive energy filter 23 thus operates as a shielding means during the fabrication process, and it is to be understood that other shielding means having different radiation transmission and attenuation characteristics may be utilized in lieu of EUV-transmissive energy filter 23 in order to prevent damage to passivation layer 21 during pattern formation. Alternatively, pattern 27 can be formed using a lift-off or other technique, in which case EUV-transmissive filter 23 can be dispensed with altogether. These steps are also low temperature procedures to avoid the deleterious effects of high temperature.

The above are exemplary modes of carrying out the invention and are not intended to be limiting. It will be apparent to those skilled in the art that modifications thereto can be made without departure from the spirit and scope of the invention as set forth in the following claims.

What is claimed is:

1. A monolithic pattern-sensitive detector for detecting extreme ultraviolet (EUV) radiation, comprising:

a shallow junction photodiode having a first diffusion region for generating current responsive to EUV photons; and a reference pattern provided on the shallow junction photodiode, the reference pattern transmitting EUV photons to the diffusion region.

2. The detector of claim 1, further comprising an EUV-transmissive energy filter disposed between the shallow junction photodiode and the reference pattern, the EUV-transmissive energy filter having an intrinsic photon absorption characteristic favoring transmission of EUV photons of a predetermined energy level over transmission of lower energy photons.

3. The detector of claim 2, wherein the EUV-transmissive energy filter has an absorption rate of about 10% for EUV photons and an absorption rate of about 99.9% for photons of lower energy than EUV photons.

4. The detector of claim 3, wherein the EUV-transmissive energy filter comprises zirconium.

5. The detector of claim 3, wherein the EUV-transmissive energy filter comprises a material selected from the group consisting essentially of beryllium, zirconium, niobium and yttrium.

6. The detector of claim 2, wherein the EUV-transmissive energy filter comprises a bandpass filter.

7. The detector of claim 1, further comprising an EUV absorber for defining the reference pattern.

8. The detector of claim 7, wherein the EUV absorber has a thickness of about 1,000 Å and attenuates incoming EUV photons by a factor of at least $10^4$.

9. The detector of claim 7, wherein the EUV absorber comprises nickel.

10. The detector of claim 7, wherein the EUV absorber comprises a material selected from the group consisting essentially of nickel, silver, germanium and gold.

11. A method of making a monolithic, pattern-sensitive EUV detector, the method comprising:

forming an EUV absorber over a diffusion region of a shallow junction photodiode; and forming a pattern in the EUV absorber, the pattern comprising a region capable of transmitting EUV photons to the diffusion region.

12. The method of claim 11, wherein the EUV absorber is formed on a passivation layer disposed over the diffusion region.

13. The method of claim 11, further comprising the step of forming an EUV-transmissive energy filter over the diffusion region.

14. The method of claim 13, wherein the step of forming a pattern comprises a direct ray electron beam process.

15. The method of claim 13, wherein the step of forming a pattern comprises a dry etch process using reactive ion etcher.

16. The method of claim 11, wherein the step of forming a pattern comprises a lift-off process.

17. The method of claim 13, wherein the EUV-transmissive energy filter has an intrinsic photon absorption characteristic favoring transmission of EUV photons of a predetermined energy level over transmission of lower energy photons.

18. The detector of claim 17, wherein the EUV-transmissive energy filter has an absorption rate of about 10% for EUV photons and an absorption rate of about 99.9% for photons of lower energy than EUV photons.

19. The detector of claim 18, wherein the EUV-transmissive energy filter comprises zirconium.

20. The detector of claim 18, wherein the EUV-transmissive energy filter comprises a material selected from the group consisting essentially of beryllium, zirconium, niobium and yttrium.

21. The detector of claim 17, wherein the EUV-transmissive energy filter comprises a bandpass filter.

22. The detector of claim 11, wherein the EUV absorber has a thickness of about 1,000 Å and attenuates incoming EUV photons by a factor of at least $10^4$.

23. The detector of claim 11, wherein the EUV absorber comprises nickel.

24. The detector of claim 11, wherein the EUV absorber comprises a material selected from the group consisting essentially of nickel, silver, germanium and gold.

* * * * *